United States Patent [19]

Khoe et al.

[11] Patent Number: 4,692,208
[45] Date of Patent: Sep. 8, 1987

[54] METHOD OF MANUFACTURING A LIGHT-EMITTING DEVICE

[75] Inventors: Giok D. Khoe; Henricus M. De Vrieze, both of Eindhoven, Netherlands

[73] Assignee: U.S. Philips Corporation, New York, N.Y.

[21] Appl. No.: 654,834

[22] Filed: Sep. 26, 1984

[30] Foreign Application Priority Data

Sep. 28, 1983 [NL] Netherlands .......................... 8303316

[51] Int. Cl.[4] .......................... B44C 1/22; H01L 21/00
[52] U.S. Cl. .................. 156/659.1; 156/663; 437/225
[58] Field of Search .............. 357/17, 74; 174/52 H; 156/657, 659.1, 663; 65/37; 29/569 L; 204/192.1

[56] References Cited

U.S. PATENT DOCUMENTS

| | | | |
|---|---|---|---|
| 3,582,300 | 6/1971 | Coombes et al. | 65/39 |
| 3,733,258 | 5/1973 | Hanak et al. | 204/192 |
| 3,795,557 | 3/1974 | Jacob | 156/662 |
| 3,806,365 | 4/1974 | Jacob | 134/1 |
| 3,816,847 | 6/1974 | Nagao | 357/74 |
| 3,839,177 | 10/1974 | Dimigen | 204/192 |
| 4,366,492 | 12/1982 | Kitamura | 357/74 |
| 4,403,243 | 9/1983 | Hakamada | 357/74 |
| 4,505,765 | 3/1985 | Trommer | 357/17 |

OTHER PUBLICATIONS

Ephrath, "Journal of the Electro Chemical Society", vol. 126, No. 8, 8/79 pp. 1419-1421.

Primary Examiner—S. Leon Bashore
Assistant Examiner—Michael K. Boyer
Attorney, Agent, or Firm—Robert T. Mayer; Steven R. Biren

[57] ABSTRACT

On a support which supports a light-emitting semiconductor device there is arranged a cap which is hermetically sealed to the support. In the cap there is provided a transparent plate, an inner layer of which facing the semiconductor device consists of a material having a high refractive index ($>1.7$). On the outer side of the plate there is provided a layer of photosensitive lacquer which is exposed to the light emitted by the semiconductor device. After development of the layer of lacquer, only the exposed part which is situated opposite the semiconductor device remains. This part is heated to the melting point, thus forming a droplet of lacquer, after which the outer layer of the plate and the droplet of lacquer are removed by way of a non-selective etching method, so that a lens which is situated opposite the semiconductor device and a flat window which surrounds the lens are automatically formed at the same time.

2 Claims, 6 Drawing Figures

METHOD OF MANUFACTURING A LIGHT-EMITTING DEVICE

BACKGROUND OF THE INVENTION

The invention relates to a method of manufacturing a light-emitting device in which a cap comprising a flat, transparent widow is arranged on a support which supports a light-emitting semiconductor device, said cap being hermetically sealed to the support and said window being provided with a lens. The invention also relates to a light-emitting device manufactured by means of the method in accordance with the invention and comprising a support on which there is arranged a light-emitting semiconductor device and a cap which is arranged on the support and which is hermetically sealed thereto, said cap comprising a window with a lens.

U.S. Pat. No. 3,816,847 discloses a method where a hemispherical lens is secured on a window formed by a flat glass plate by means of a suitable bonding material. The known method has drawbacks in that the correct alignment of the lens with respect to the semiconductor device situated within the envelope is difficult and time-consuming and in that very severe requirements must be imposed on the bonding material in order to prevent discoloration or deterioration of the bonding strength in the course of time.

SUMMARY OF THE INVENTION

It is the object of the invention to provide a method which ensures that the lens automatically occupies the correct position with respect to the semiconductor device, without it being necessary to provide a bonding material between the lens and the window.

To this end, the method in accordance with the invention is characterized in that the window and the lens are formed by arranging a transparent plate in the cap, at least an inner layer of said plate which faces the semiconductor device being made of a material having a high refractive index, a layer of photosensitive lacquer being provided on the outer side of the plate after the connection of the cap to the support, after which a part of the layer of lacquer is exposed to light emitted by the semiconductor device, followed by development, so that only the exposed part which is situated opposite the semiconductor device remains, said exposed part subsequently being heated to the melting point, thus forming a droplet of lacquer, after which an outer layer of the plate and the droplet of lacquer are removed by a non-selective etching method so that the lens situated opposite the semiconductor device and a flat window surrounding the lens are formed at the same time. A high refractive index is to be understood to mean herein a refractive index which amounts to at least 1.7 for the light emitted by the semiconductor device. Because the photosensitive lacquer is exposed by the semiconductor device itself, the lens will be automatically formed in the position where the light of the device emerges from the window. Due to the heating, the lacquer melts, which means in this context that the lacquer becomes liquid or is softened to such an extent that it contracts so as to form a substantially dome-shaped droplet due to surface tension. Because the lens and the window are made of the same material, no separate bonding material is required for the bond between the window and the lens.

A preferred version of the method in accordance with the invention is characterized in that on its side which faces the outer side of the cap, the plate which is used to form the window and the lens comprises a layer of a material having a refractive index which is lower than that of the material of the layer on its inner side, the etching operation being continued at least until the outer layer has been completely removed at the area of the lens. By a suitable choice of the refractive index and the thickness of the layer having a low refractive index, the dimensions of the lens can be influenced. This version of the method is related to a previous method of applying a lens on the surface of a non-exposed semiconductor laser previously proposed by Applicant (in unpublished NL Patent Application No. 8204273).

The device in accordance with the invention is characterized in that the lens and the window are formed as one integral unit from a layer of material having a high refractive index. The semiconductor device is preferably a semiconductor laser.

BRIEF DESCRIPTION OF THE DRAWING

The invention will be described in detail hereinafter with reference to the accompanying diagrammatic drawing, in which.

DESCRIPTION OF THE PREFERRED EMBODIMENT

Figure 1:
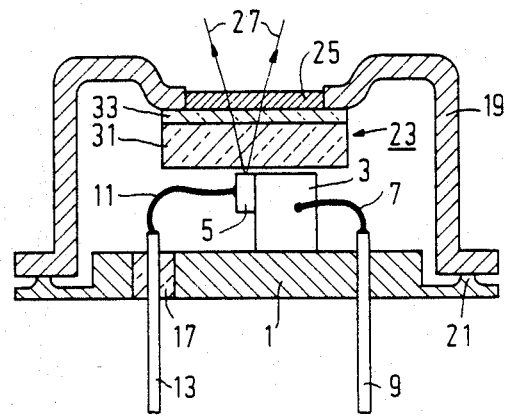
FIG. 1 is a sectional view of a semiconductor laser in a hermetically sealed envelope during a first phase of the method in accordance with the invention.

The device shown in FIG. 1 comprises a metal support 1 with a raised portion 3 on which there is provided a light-emitting semiconductor device 5, in this case a semiconductor laser. An electrode of the laser 5 is connected to a first connection pin 9 via the raised portion 3 and a connection wire 7. The second electrode is connected to a second connection pin 13 via a connection wire 11. The connection pin 13 extends to the outer side of the support 1 via a glass passage 17. On the support 1 there is arranged a metal cap 19 which is hermetically sealed to the support by means of a welded joint 21. A hermetically sealed envelope of this kind is known, for example, from U.S. Pat. No. 4,295,152.

Opposite the laser 5 (at the upper side in FIG. 1), the cap 19 comprises an aperture which is hermetically sealed by a transparent plate 23 through which light can emerge from the laser. During the phase of the method shown in FIG. 1, the plate 23 is provided on its outer side (the side which is remote from the laser 1) with a layer of photosensitive lacquer 25. When the laser 5 emits a light-beam 27, a part of the layer 25 which is situated directly over the laser is exposed.

Figure 2:
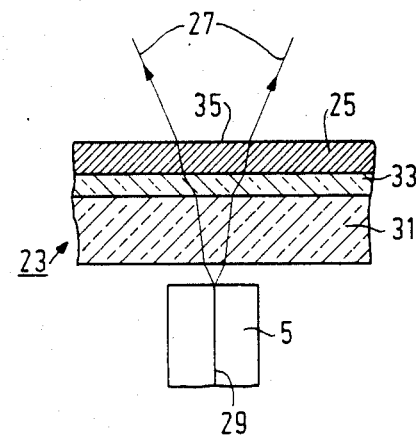
FIG. 2 shows a detail of FIG. 1 at an enlarged scale.

FIG. 2 is a view at an enlarged scale of the part of the plate 23 with the layer 25 which is situated directly over the laser 5. The active part of the laser 5 is denoted by the reference numeral 29 in FIG. 2. The layer of lacquer 25 consists of a lacquer which is sensitive to the light which is emitted by the laser 5 at a wavelength of, for example 850 nm. These types of lacquers are commercially available, for example as Kodak 747 and Solvarist 6000. Due to the exposure, the solubility of the lacquer in the developer is reduced.

In the embodiment shown, the plate 23 consists of two layers, that is to say a first layer 31 which is situated on the inner side of the envelope (facing the laser 5) and which consists of a material having a high refractive index, and a second, outer layer 33 which has a lower refractive index. The material of the first layer 31 has a refractive index of at least 1.7 for the light emitted by the laser 5. Suitable materials for this layer are, for example $Y_2O_3$, $As_2S_3$, $Dy_2O_3$, $Gd_2O_3$, $Tm_2O_3$, $Yb_2O_3$, $Ga_2O_3$, $HfO_2$, ZnS. Furthermore, various suitable types of glass having a high refractive index are also commercially available. The second layer consists of a material having a lower refractive index, for example $SiO_2$, $MgF_2$, or $Al_2O_3$.

The divergence of the light beam 27 emitted by the laser 5 is substantially less in the first layer 31 than in the space between the laser and the first layer. In the second layer 33, in which the refractive index is lower, the divergence is again higher. Consequently, the thickness of the outer layer 33 determines the width of the beam 27 at the area of the layer of lacquer 25 to a high degree. The choice of this thickness (and evidently also of the refractive index), therefore, determines the lateral extent of the exposed part 35 of the layer of lacquer 25 to a high degree. It will be apparent that the outer layer 33 may be omitted when extension of the width of the exposed part 35 of the layer of lacquer is not considered necessary.

Figure 3:
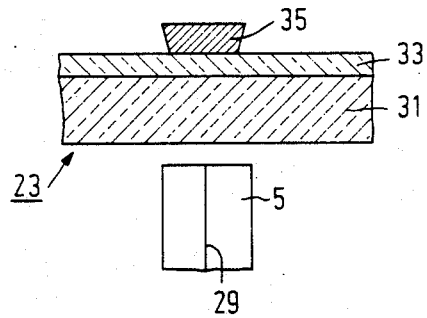
FIGS. 3 to 5 show the detail of FIG. 2 during further phases of the method.

After the exposure, the layer of the lacquer 25 is developed, the exposed part 35 then remaining behind. The situation then obtained is shown in FIG. 3.

Figure 4:
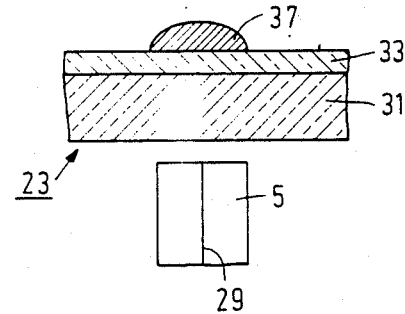

The exposed part 35 of the layer is then heated to such a temperature that it melts. This temperature is below 100° C. for most types of lacquer. Heating can be performed, for example by arranging the entire device in an oven or by exposing the part 35 to infrared light. In reaction to melting, the exposed part assumes the shape of a droplet of lacquer 37. Surface tension ensures that the surface of the droplet 37 becomes spherical as appears from FIG. 4. The shape and the dimensions of the droplet 37 are depending on the shape and the dimensions of the exposed part 35 and, consequently, are co-determined by the thickness of the outer layer 33.

Figure 5:
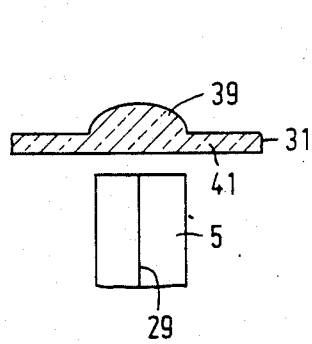

After solidification of the droplet 37, the droplet, the outer layer 33 and a part of the inner layer 31 are removed by means of a non-selective etching method which produces the ultimate result shown in FIG. 5. A non-selective etching method is to be understood to mean herein an etching method which is approximately the same etching rate for the three materials of the layers 25, 33, 31, so that ultimately a lens 39 whose shape corresponds approximately to the shape of the droplet 37 is formed in the layer 31. A suitable etching method is, for example reactive ion etching. The part of the layer 31 which is situated adjacent the lens 39 forms a flat window 41. FIG. 5 clearly shows that, thanks to the method used, the lens 39 is automatically formed exactly over the active part 29 of the laser 5.

Figure 6:
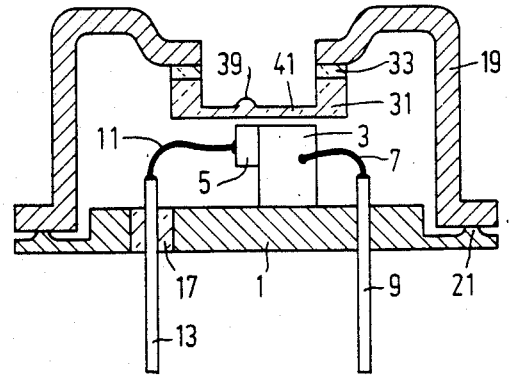
FIG. 6 is a sectional view, corresponding to that of FIG. 1, after execution of the method.

FIG. 6 shows the complete light-emitting device after execution of the method in a sectional view which corresponds to that of FIG. 1. It appears that substantially no material has been removed from the cap 19 during the etching operation. This can be achieved by choosing an etching method which does not discriminate between the materials of the layer of lacquer 25 and the plate 23, but which does not substantially affect the metal of the cap 19. Alternatively, the cap 19 may be protected by a layer of lacquer (not shown) during etching, said layer leaving an opening in the cap free at the window.

What is claimed is:

1. A method of manufacturing a light-emitting device in which a cap comprising a flat, transparent window on a support which supports a light-emitting semiconductor device, said cap being hermetically sealed to the support and said window being provided with a lens, said method comprising the steps of forming the window and the lens by providing a transparent multiple-layer plate in the cap at the area where said window is to be formed, the innermost layer of said plate which faces the semiconductor device being made of a material having a higher refractive index than that of the outermost layer, providing a layer of photosensitive lacquer on the outer side of the plate after connecting the cap to the support, then exposing a part of the layer of lacquer to light emitted by the semiconductor device and the developing said exposed layer part, so that only the exposed part which is situated opposite the semiconductor device remains, then heating said exposed part to the melting point to form a droplet of lacquer, then removing an outer layer of the plate and the droplet of lacquer by a non-selective etching method to form the lens opposite the semiconductor device and a flat window surrounding the lens at the same time.

2. A method as claimed in claim 1, wherein, on the side which faces the outer side of the cap, the plate which is used to form the window and the lens comprises an outer layer of a material having a refractive index which is lower than that of the material of the layer on the inner side of said plate, and where the etching operation is continued at least until the outer layer has been completely removed at the area of the lens.

* * * * *